(12) United States Patent
O'Keeffe et al.

(10) Patent No.: US 7,385,262 B2
(45) Date of Patent: Jun. 10, 2008

(54) BAND-STRUCTURE MODULATION OF NANO-STRUCTURES IN AN ELECTRIC FIELD

(75) Inventors: James O'Keeffe, Menlo Park, CA (US); Kyeongjae Cho, Union City, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1195 days.

(21) Appl. No.: 09/994,534

(22) Filed: Nov. 27, 2001

(65) Prior Publication Data
US 2003/0098488 A1 May 29, 2003

(51) Int. Cl.
*H01L 29/76* (2006.01)
(52) U.S. Cl. .............. 257/401; 257/288; 257/368; 257/E29.322; 257/E29.339; 977/749; 977/755
(58) Field of Classification Search .......... 257/401, 257/23, 25, 1, 22, 15, 14, 17, 627, 628, 288, 257/368, E29.322, E29.339, E29.194; 977/749, 977/755, 815
See application file for complete search history.

(56) References Cited

U.S. PATENT DOCUMENTS

| | | | | |
|---|---|---|---|---|
| 5,401,975 | A * | 3/1995 | Ihara et al. | 250/492.3 |
| 5,597,457 | A * | 1/1997 | Craig et al. | 204/165 |
| 5,689,603 | A * | 11/1997 | Huth | 385/131 |
| 5,705,824 | A * | 1/1998 | Lafrate et al. | 257/23 |
| 5,714,765 | A * | 2/1998 | Noetzel et al. | 257/17 |
| 5,903,010 | A | 5/1999 | Flory et al. | 257/24 |
| 6,059,627 | A * | 5/2000 | Dean et al. | 445/24 |
| 6,128,214 | A * | 10/2000 | Kuekes et al. | 365/151 |
| 6,153,318 | A * | 11/2000 | Rothberg | 428/692 |
| 6,280,677 | B1 * | 8/2001 | Yakobson | 264/430 |
| 6,333,516 | B1 * | 12/2001 | Katoh et al. | 257/22 |
| 6,355,749 | B1 * | 3/2002 | Chung et al. | 526/255 |
| 6,413,659 | B1 * | 7/2002 | Rothberg | 428/692 |
| 6,423,412 | B1 * | 7/2002 | Zhang et al. | 428/421 |
| 6,423,583 | B1 * | 7/2002 | Avouris et al. | 438/132 |
| 6,430,511 | B1 * | 8/2002 | Tour et al. | 702/19 |

(Continued)

FOREIGN PATENT DOCUMENTS

DE        100 32 414        * 11/2001

OTHER PUBLICATIONS

"Fullerene Nanotubes: $C_{1,000,000}$ and Beyond," B.I. Yakobson et al., *American Scientist*, vol. 85, Jul./Aug. 1997, pp. 324-336.

(Continued)

*Primary Examiner*—Thomas Dickey
*Assistant Examiner*—Fazli Erdem
(74) *Attorney, Agent, or Firm*—Davis Wright Tremaine LLP

(57) ABSTRACT

A method to electronically modulate the energy gap and band-structure of semiconducting carbon nanotubes is proposed. Results show that the energy gap of a semiconducting nanotube can be narrowed when the nanotube is placed in an electric field perpendicular to the tube axis. Such effect in turn causes changes in electrical conductivity and radiation absorption characteristics that can be used in applications such as switches, transistors, photodetectors and polaron generation. By applying electric fields across the nanotube at a number of locations, a corresponding number of quantum wells are formed adjacent to one another. Such configuration is useful for Bragg reflectors, lasers and quantum computing.

28 Claims, 9 Drawing Sheets

U.S. PATENT DOCUMENTS

| | | | |
|---|---|---|---|
| 6,751,365 B2* | 6/2004 | Zhang et al. | 385/2 |
| 2002/0008445 A1* | 1/2002 | Pelrine et al. | 310/330 |
| 2002/0074537 A1* | 6/2002 | John et al. | 252/584 |
| 2002/0130311 A1* | 9/2002 | Lieber et al. | 257/1 |
| 2002/0166620 A1* | 11/2002 | Scheinbeim et al. | 156/160 |
| 2003/0148562 A1* | 8/2003 | Luyken et al. | 438/197 |

OTHER PUBLICATIONS

"Can electric field induced energy gaps in metallic carbon nanotubes," X. Zhou et al., *Journal of Condensed Matter*, vol. 13, 2001, pp. L634-L640.

"Nanotube Nanotweezers," P. Kim et al., *Science*, vol. 286, Dec. 10, 1999, pp. 2148-2150.

"Computational Nanotechnology With Carbon Nanotubes and Fullerenes," D. Srivastava et al., *Computing and Science Engineering*, Jul./Aug. 2001, pp. 42-55.

"A silicon-based nuclear spin quantum computer," B.E. Kane, *Nature*, vol. 393, May 14, 1998, pp. 133-137.

*Semiconductor Optoelectronic Devices*, D.A.B. Miller, Chapters 7 and 8, Winter 2000, pp. 157-158 and 168-171.

"Carbon Nanotubes—A New Class of 1D Conductors," M. Bockrath et al., 6 pages.

"Quantum Computing with Molecules," N. Gershenfeld et al., *Scientific American*, Jun. 1998, 9 pages.

"A scalable quantum computer with ions in an array of microtraps," J.I.Cirac et al., *Nature*, vol. 404, Apr. 6, 2000, pp. 579-581.

"Polarons in Carbon Nanutubes," M. Verissimo-Alves et al., *Physical Review Letters*, vol. 86, No. 15, Apr. 9, 2001, pp. 3372-3375.

Iterative minimization techniques for *ab initio* total-energy calculations: molecular dynamics and conjugate gradients, M.C. Payne et al., *Reviews of Modern Physics*, vol. 64, No. 4, Oct. 1992, pp. 1045-1097.

Xin Zhou et al., *Can electric field induced energy gaps in metallic carbon nanotubes?*, J. Phys.: Condens. Matter 13 (2001) L635-L640.

Philip Kim et al., *Nanotube Nanotweezers*, Dec. 10, 1999, vol. 286, Science, pp. 2148-2150.

Boris I Yakobson et al., *Fullerene Nantubes: C1,000,000 and Beyond*, American Scientist, vol. 85, pp. 324-226.

Deepak Srivastava, *Computational Nanotechnology with Carbon Nanotubes and Fullerenes*, Computing in Science & Engineering, Jul./Aug. 2001, pp. 42-55.

B.E. Kane, *A silicon-bases nuclear spin quantum computer*, Nature, vol. 393, May 14, 1998, pp. 133-137.

Mark Bockrath, *Carbon Nanotubes—A new Class of 1D Conductors*, Dr. Paul McEuen, ITP & UC Berkeley, 6 pages.

Neil Gershenfeld et al., *Quantum Computing with Molecules*, Scientific American, 1998, 0698 issue, 9 pages.

J.I. Cirac et al., *A scalable quantum compouter with ions in an array of microtraps*, Nature, vol. 404, Apr. 6, 2000, pp. 579-581.

M. Verissimo-Alves et al., *Polarons in Carbon Nanotubes*, The American Physical Society, vol. 86, No. 15, pp. 3372-3375.

M.C. Payne, *Iterative minimization techniques for ab initio total-energy calculations: molecular dynamics and conjugate gradients*, Review of Modern Physics, vol. 64, No. 4, Oct. 1992, pp. 1045-1097.

Sander J. Tans, *Room-temperature transistor based on a single carbon nanotube*, Nature, vol. 393, May 7, 1998, pp. 49-51.

D.A.B. Miller, *7. Modulators*, 243.Semiconductor Optoelectronic Devices, Winter 2000, pp. 157-158.

D.A.B. Miller, *8. Semiconductor lasers*, 243.Semiconductor Optoelectronic Devices, Winter 2000, pp. 168-171.

Seongjun Park, *Endo-fullereness and Doped Bucky Onions as Seed Materials for Solid State Quantum Bits*, 5 pages.

* cited by examiner

Energy gap reduces
from 0.4eV to 0.1eV

BAND-STRUCTURE MODULATION OF NANO-STRUCTURES IN AN ELECTRIC FIELD

BACKGROUND OF THE INVENTION

This invention relates in general to nano-structures, and in particular to applications involving band-structure modulation of such structures in an electric field.

Nowadays integrated circuits dominate electronics and have become one of the world's largest and most critical industries. The last few decades have seen a continual miniaturization of integrated circuits. However, due to physical limitations, such downsizing of integrated circuits is reaching its limits. The present scale of devices is on the order of tenths of microns. Nanometer scale devices have been proposed as a solution. One nanometer scale device that has been proposed is the carbon nanotube. Carbon nanotubes possess several interesting physical and electronic properties. Semi-conducting nanotubes have been grown up to several microns in length. In addition ohmic contacts to nanotubes have been demonstrated using Au and Pt electrodes. See, for example, the articles A. Bachtold, M. Henry, C. Terrier, C. Srtunk, C. Schroenberger, J.-P. Salvetat, J.-M. Bonard, and L. Forro, Appl. Phys. Lett. 73, 274 (1998) and S. J. Tans, M. H. Devoret, H. Dai, A. Thess, R. E. Smalley, L. J. Geerligs, and C. Dekker, Nature (London) 386, 474 (1997). Such properties have prompted research on single wall nanotubes (SWNT) as semiconducting channels in nanoscale field-effect transistors (FETs). This is explained in more detail in S. J. Tans, A. R. M. Verschueren, and C. Dekker, Nature (London), 393,49 (1998) and R. Martel, T. Schmidt, H. R. Shea, T. Hertel, and Ph. Avouris, Appl. Phys. Lett. 73,2447 (1998).

In typical nanotube FET designs, the tube acts as one of the MOS capacitor plates, as shown in FIG. 1a. In response to a gate voltage Vg larger than some threshold Vt, the Fermi energy of the nanotube moves into the conduction or valence land. In cases where the gate thickness oxide is much greater than the tube diameter the nanotube reaches a uniform potential $E_F$ at all points about the circumference. The charge on the tube is given by $$Q_{tube} = \int_0^{E_F} eD(E) = C_g(V_g - V_T)$$

where D(E) is the density of conduction or valence band states and $C_g$ is the gate capacitance. In the ideal case this gives a conductance between the source and drain of $ne^2/h$, where n is the number of subbands which cross the Fermi energy.

While the above-described miniature devices employing the carbon nanotube have shown potential, none of these devices is entirely satisfactory. It is therefore desirable to provide systems employing nano-structures with improved characteristics.

SUMMARY OF THE INVENTION

This invention is based on the recognition that, by altering the energy band structure of a nano-structure, different characteristics of the nano-structure can be modified in a number of different applications. The energy band of an elongated structure with nanometer cross-sectional dimensions (hereinafter "nano-structure") may be modified by the application of an electric field across the nano-structure in a direction transverse to the length of the elongated nano-structure. Preferably, the electric field can be applied by means of two components substantially on opposite sides of the nano-structure. The nano-structure may for example be a nano-wire or nanotube.

Viewed from another angle, the invention may be understood as modifying the energy bandstructure of the nano-structure by causing an electrical potential gradient to develop around a perimeter of the elongated structure so that energy band gap of the elongated structure is altered. In one embodiment, this is accomplished by means of device that applies an electric field to the nano-structure in a direction transverse to its length.

One effect of altering the energy band structure or gap of the elongated nano-structure is to cause a change in the electrical conductance of the nano-structure. In response to the electric field applied, electrical charge on the nano-structure can be redistributed without changing the net electrical charge on the nano-structure, and the redistribution is therefore faster than where there is a change in net electrical charge on the nano-structure. Such change in electrical conductance of the nano-structure can be used in a switch or a nanometer scale transistor.

The modulation of the energy band structure or gap of the nano-structure also causes a shift in optical energy absorption wavelength characteristics of the nano-structure. By controlling the electric field applied, such a shift in optical energy absorption wavelength characteristics of the nano-structure can be controlled in a nanometer scale photodetector.

The modulation of the energy band structure or gap of the nano-structure also causes the length of the elongated nano-structure to change, which is useful in a nanometer scale polaron apparatus.

Electric fields may be applied at different points along the elongated nano-structure to cause a plurality of quantum wells along a length of the nano-structure. Electric fields are applied at locations so that the wells are spaced apart by spacings selected so that the nano-structure reflects radiation of predetermined wavelength(s). Thus, one can control the wavelength of the reflection by the nano-structure by controlling the spacings between the quantum wells. When employed adjacent to an optical gain region into which electrons and holes are injected, the reflection of radiation of selection wavelengths from the optical gain region back into the region causes the region to lase so that a nanometer scale laser results.

Electric fields may be applied at adjacent locations of the elongated nano-structure to generate quantum wells adjacent to one another in the nano-structure for trapping ions. The state of ions in any one of the wells may be detected by placing an ion tip in the vicinity of the well in a reading operation. If radiation is supplied to the well, the presence of the ion tip in the vicinity of the well induces a change in state of the ions in the well in a writing operation. The change of state of ions in one quantum well may cause a change in state of ions in an adjacent well. Such operations may be used for quantum computing.

BRIEF DESCRIPTION OF THE DRAWINGS

FIG. 15b is a schematic view of the nanotube or nanowire of FIG. 15a and of an ion chip in the vicinity of a quantum well and laser light supplied to the well to illustrate a process in the quantum computer of FIG. 15a.

For simplicity in description, identical components are identified by the same numerals in this application.

DETAILED DESCRIPTION OF THE EMBODIMENTS

Figure 1A:
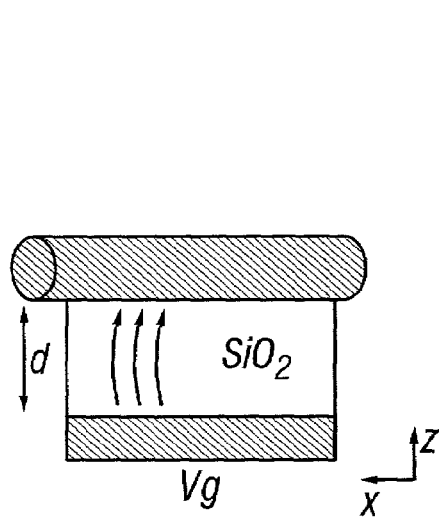
FIG. 1a is a partly perspective and partly schematic view of a semiconducting channel in a conventional carbon nanotube MOSFET design, where the nanotube acts as a capacitor plate and builds up a net surface charge.
Figure 1B:
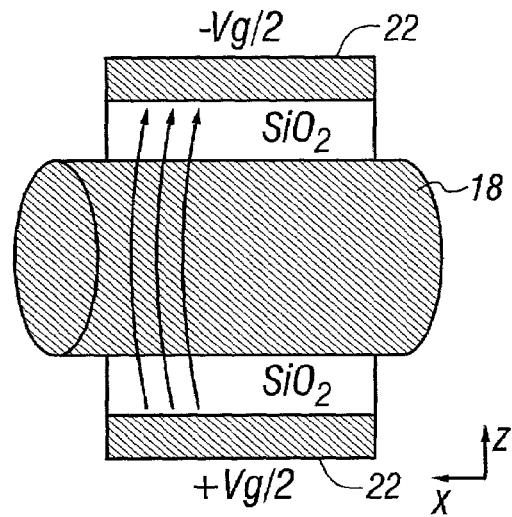
FIG. 1b is a partly perspective and partly schematic view of a carbon nanotube placed between two electrodes in a split-gate approach to illustrate an embodiment of the invention where a potential gradient is created about the tube's circumference.

The structure in FIG. 1b illustrates the invention. This structure has two main differences from the conventional nanotube MOS capacitor model. Firstly, instead of being one of the capacitor electrodes the nanotube is placed in the center of the dielectric gap. In this way the capacitor (with plates 22) acts as a split-gate on the nanotube, with gate voltages of $\pm V_g/2$ respectively. Because of its position the fermi energy for the tube can be maintained at 0V in simulations. The advantage of this approach is that no net charge needs to enter the nanotube 18 to reach equilibrium, irrespective of the value of $V_g$ so that the equilibrium can be reached faster. Secondly, the dielectric gap d is chosen to be similar to the nanotube diameter $d_t$. This results in a considerable portion of $V_g$ appearing as a potential gradient at the atom locations about the nanotube circumference. Where the tube 18 is not cylindrical, this gradient appears around the tube perimeter. Changes in the band-structure and conductance as a result of the potential gradient have been investigated.

The proposed energy gap modulation mechanism illustrated in FIG. 1b could allow hetrostructures to be created in uniform nanotubes, where a gating electric field is applied to several sections of the tube. Closely spaced hetrostructures also open the possibility for electrically controlled quantum confinement, in which the well shape could be dynamically varied. As the energy gap of the tube decreases, there is an associated increase in tube conductance, which could be utilized in switching applications.

Following the formalism of P. Anantram, and T. R. Govindan, Phys. Rev. B, 58, 4882 (1998), a nanotube can be described using a single $\pi$ orbital hamiltonian as $$H = \sum_i \varepsilon_i c_i^* c_i + \sum_{i,j} t_{i,j} c_i^* c_j$$

where $e_i$ is the unperturbed on-site potential and $t_{ij}$ is the hopping parameter between lattice locations i and j. In the absence of defects, the unperturbed on-site potential $e_i$ is zero and the hopping parameter $t_{ij}=-3.1$ eV. $c_i^*$, $c_i$ are the creation and annihilation operators at site i. See, for example, J.-C. Charlier, T. W. Fbbesen, and Ph. Lambin, Phys. Rev. B 53, 11 108 (1996). In our case we use a 15 unit cell hamiltonian, for a zigzag (n,0) nanotube, connected at each end to a semi-infinite (n,0) lead. When a uniform electric field EOM is applied across the tube cross-section, an external potential appears at the atom locations, given by $$Vo_i = E_0 x_i$$

where $x_i$ is the distance of each atom from the center axis of the tube. In response to the external potential charges $q_i$ appear at the atom locations. This charge is considered to have a screening effect on the external potential, in the same way that a metal cylinder would screen out all external electric fields. However zigzag nanotubes do not exhibit ideal metallic behaviour and a self-consistent solution method for the charge and equilibrium potential is employed. A discrete distribution of point charges at the atom locations is considered, which acts to reduce the net on-site potential Vnt according to $$Vnt_i = Vo_i + \sum_{j}^{N,n} (q_j(4\pi\varepsilon rj))^{-1}$$

The sum is conducted over the N unit cells in the hamiltonian. Vnt was found to converge for N>10. $Vnt_i$ at the center unit cell is used to update all equivalent locations on neighbouring unit cells, as well as on the semi-infinite leads. The perturbed hamiltonian is given by $$H = \sum_{i}[\varepsilon_i + Vnt_i]c_i^*c_i + \sum_{i,j}t_{i,j}c_i^*c_j$$

Figure 2:
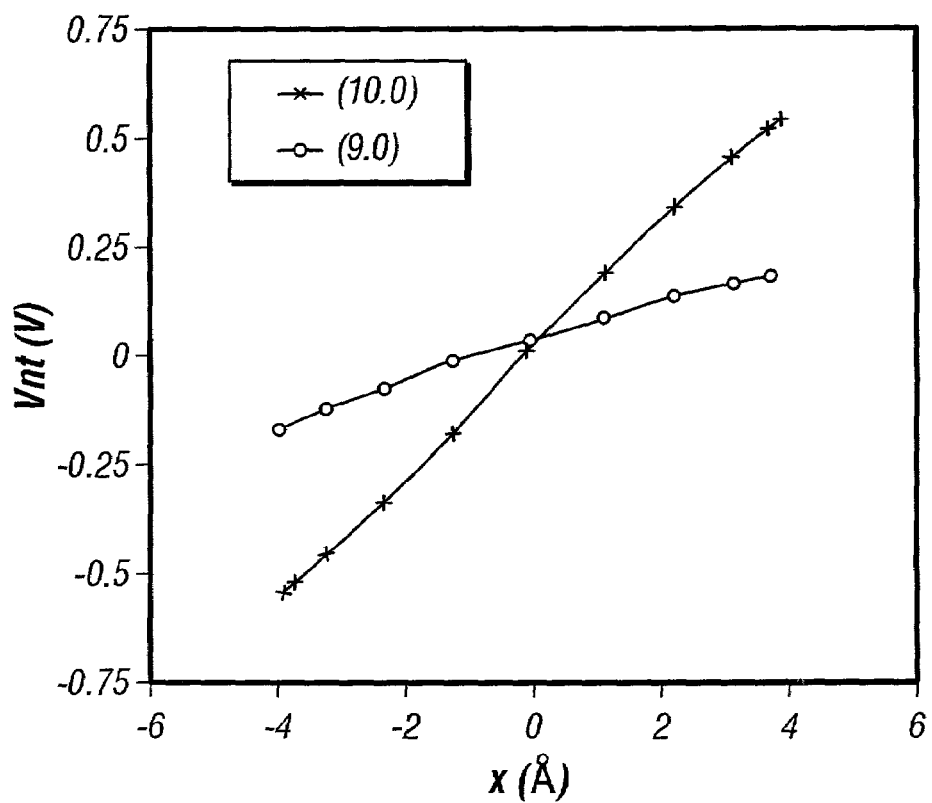
FIG. 2 is a graphical plot of the equilibrium on-site atom potentials relative to the nanotube Fermi energy, shown as a function of distance from the nanotube axis.

Finally, the net charge at the atom locations is given by $$qi = \frac{e}{\pi}\int_0^{-E_\Gamma} Im[(G^r(E))_{i,i}]dE$$

where $G^r$ is the retarded system greens function and $$\sum_{L,R}^{r}$$

are the self-energies of the left and right leads respectively. Equations (4) and (6) are solved to find a self-consistent solution. Equilibrium on-site potentials for a (9,0) metallic nanotube and a (10,0) semiconducting tube are shown in FIG. 2. Vg=2V is applied across a 12 Å dielectric, resulting in a field of 16.7 MeV/cm. In the case of a metallic nanotube there is significant charge redistribution, which screens the applied potential. In contrast, the (10,0) tube supports a peak on-site potential of 0.59 eV. Results show that semiconducting tubes do not show any significant screening for Vg<Eg $(d/D_t)$, where $d_t$ is the tube diameter. The reason for this is that the fermi energy at each atom location remains within the energy gap at low gate voltages.

Figure 3A:
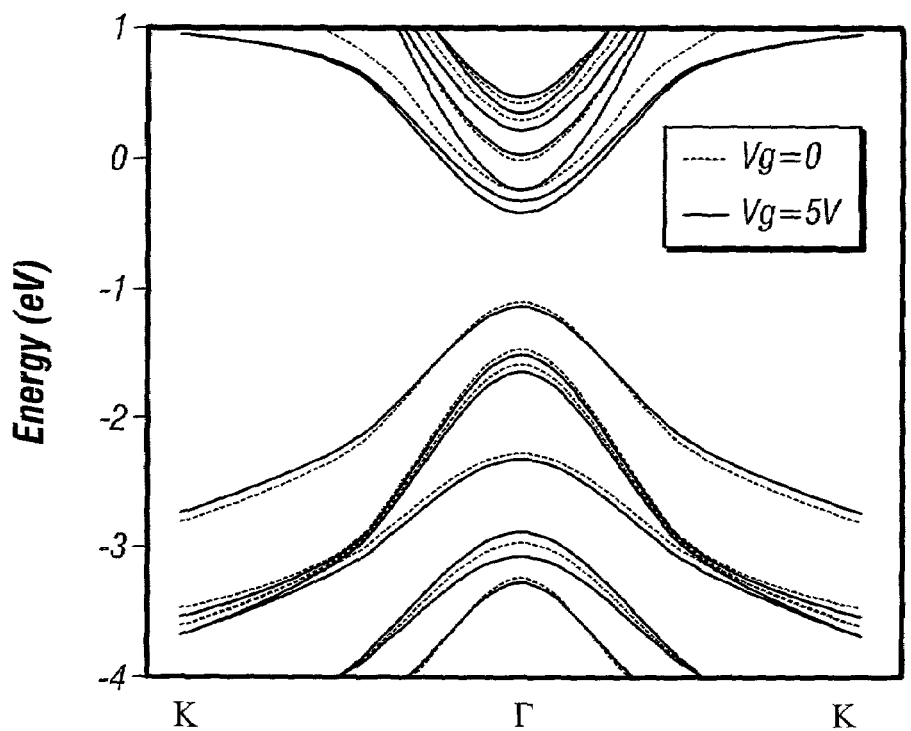
FIG. 3a is a graphical plot of the energy band structure of a carbon nanotube to illustrate the energy band structure modulation in response to applied gate voltage, where the nanotube is a semiconducting (10,0) tube.
Figure 3B:
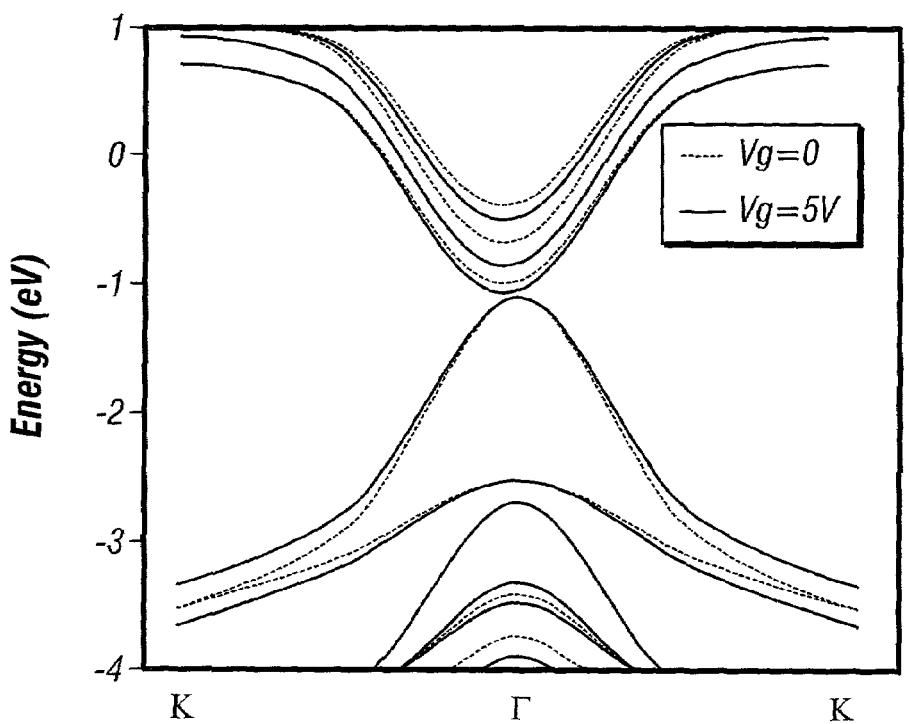
FIG. 3b is a graphical plot of the energy band structure of a carbon nanotube to illustrate the energy band structure modulation in response to applied gate voltage, where the nanotube is a metallic (9,0) tube.

The effect of a uniform electric field is also studied within the supercell approximation, using density functional theory. The simulation method used is described in M. C. Payne et al. Rev. Mod. Phys. 64 1045 (1992). Kohn-Sham single-electron wavefunctions are expanded over 17900 plane waves. The supercell has dimensions of 12×12×4.26 Å$^3$, corresponding to a 40 Ry cut-off energy. The separation of 4.26 Å in the direction of the tube axis results in an infinitely long tube. A supercell separation of 12 Å perpendicular to the tube axis is found to give no significant interaction between tubes in neighbouring cells. The Brillouin zone is sampled using three k-points along the tube axis. This is shown to agree closely with six k-point sampling in S. Peng and K. Cho, Nanotechnology, 11 (2000). FIG. 3a shows the perturbed band structure for a (10,0) SWNT with a gate voltage Vg=5V, calculated using the DFT analysis described above. The valence bands remain largely unchanged in the presence of a gate voltage, while the conduction bands move to lower energies. The energy gap is reduced from 0.89 eV to 0.73V. In addition, the lowest conduction band, which exhibits a double degeneracy in the zero bias case, is split into two separate energy levels, separated by 0.11 eV. In contrast, FIG. 3b illustrates that HOMO-LUMO band-structure of a (9,0) tube remains unchanged close to the brilloum zone center. By applying a gate voltage in a direction substantially perpendicular to the nanotube, the conduction and valence bands may be caused to intersect (the bands either side of the original energy gap), giving rise to additional conducting modes. This causes transition from the semiconducting band diagram to the metal band diagram and the gaining of additional conducting modes. In other words, when a gate voltage applied in a direction substantially perpendicular to the nanotube is increased, the conduction bands in FIG. 3a moves to lower energies so that they overlap the valence bands. This results in additional conduction modes.

Figure 4:
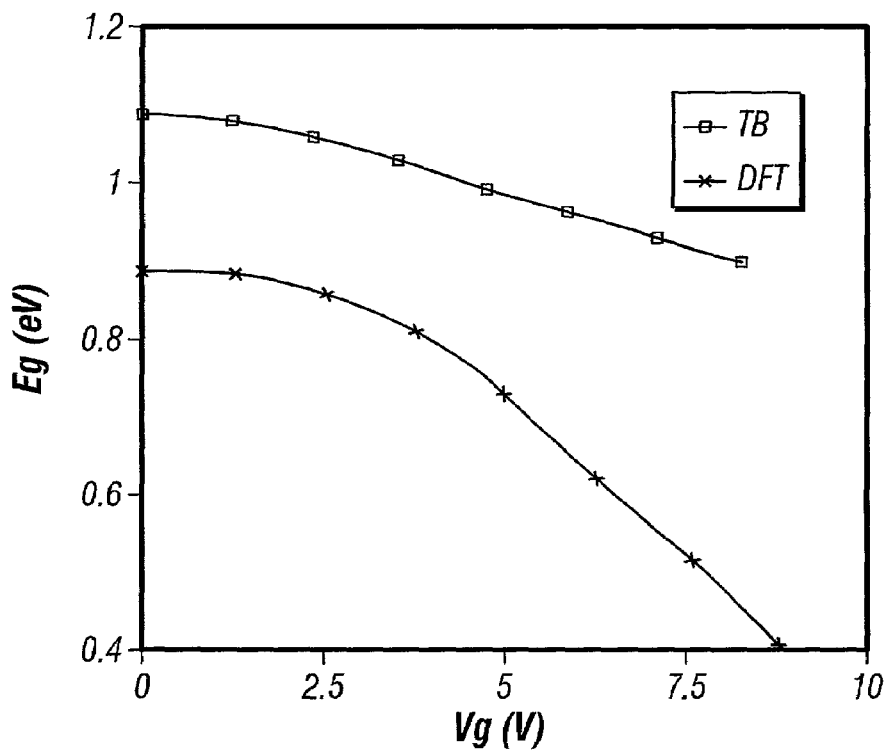
FIG. 4 is a graphical plot of the energy gap reduction as a function of gate voltage that is applied to a (10,0) nanotube.

Energy gap variation with gate voltage is illustrated in FIG. 4. The tight-binding analysis predicts a 1.08 eV energy gap for a (10,0) SWNT under zero gate bias conditions. Other experimental and theoretical work agrees closely with this value as shown in Riichiro Saito, G. Dresselhaus, M. S. Dresselhaus, J. Appl. Phys. 73, 494 (1993). The DFT results underestimate the zero bias energy gap by almost 20%. This error is common in DFT simulations of semiconductors and several correction factors have been proposed as in L. J. Sham, and M. Schluter, Phys. Rev. Lett., 51, 1888 (1983). Both the DFT and tight-binding results show a linear reduction in energy gap size after some threshold gate voltage $V_{th}$. It is also worth noting that the tight-binding simulation does not account for polarization effects in response to the gating field. The DFT analysis is therefore considered to more accurately predict the slope of the energy gap roll-off since it accounts for both polarization and charge screening effects.

Small diameter (10,0) and (9,0) SWNTs are simulated. A large electric field >20 MeV/cm was required to produce significant on-site energy variation across the small tube diameter. While these tube sizes are practical for DFT simulation the associated high fields make experimental implementation difficult. To address this issue (31,0) zigzag tubes are simulated, in which the potential gradient was supported across a larger 2.42 nm diameter. The variation of tube conductance and energy gap size are illustrated in FIG. 4. It is found that the energy gap reduces from 0.4 eV to 0.2 eV for a uniform electric field of 6.7 Mev/cm.

Thus, presented above is a method to modulate the energy gap of semiconducting carbon nanotubes, by establishing a potential gradient about the tube circumference. Metallic tubes were found to exhibit lower equilibrium potential gradients, which is consistent with charge screening behaviour at a metal surface.

Figure 5:
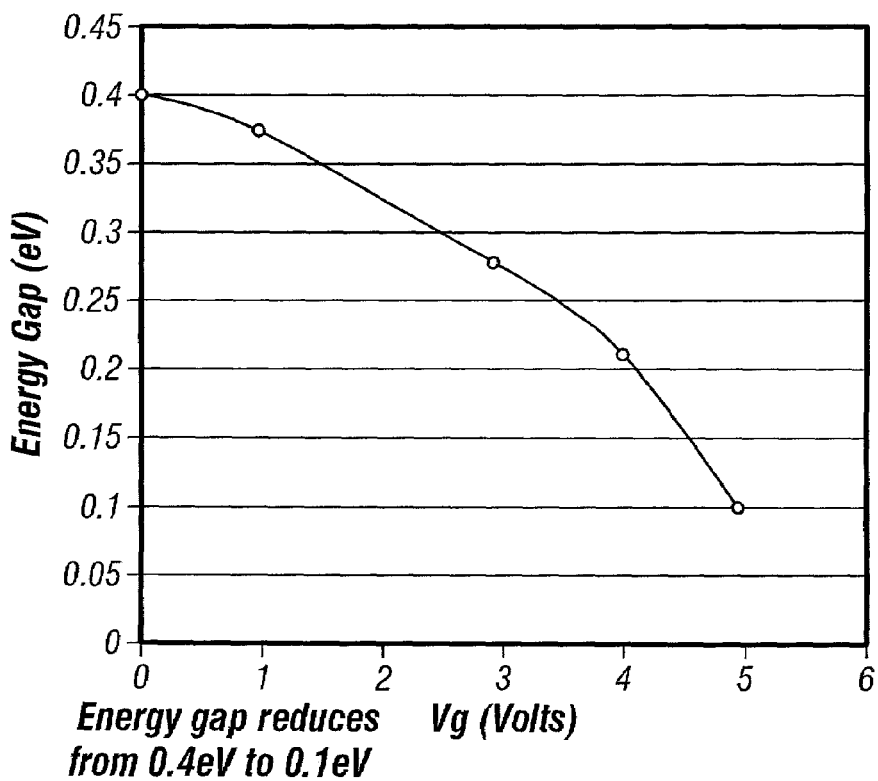
FIG. 5 is a graphical plot of energy gap change for gate voltage for a (31,0) nanotube.
Figure 6:
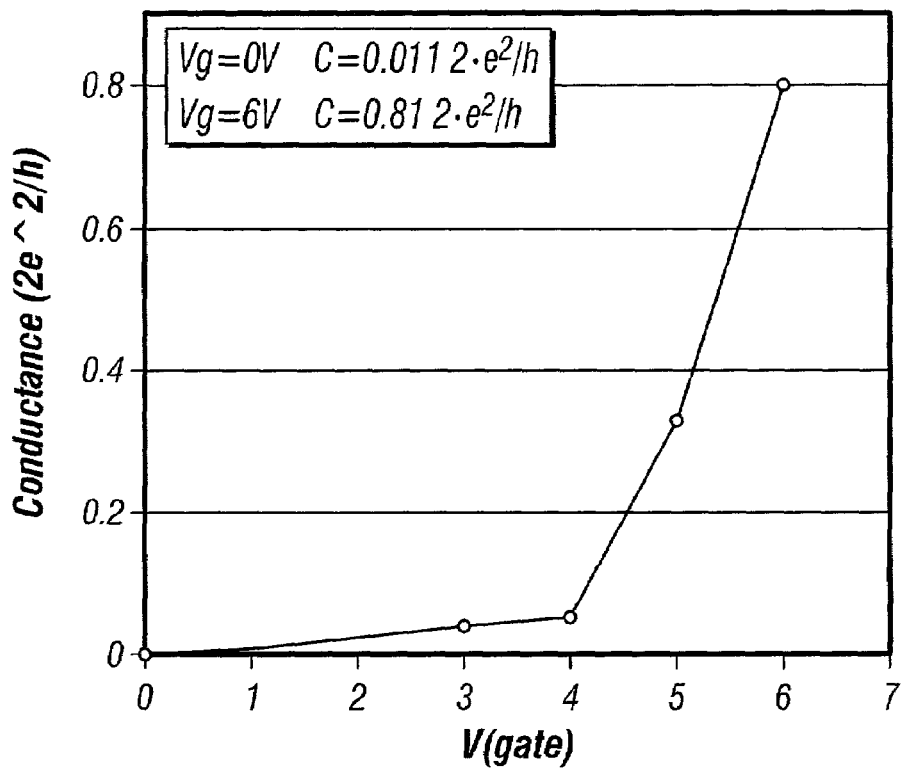
FIG. 6 is a graphical plot of the conductance change with gate voltage of the tube of FIG. 5 useful for illustrating the invention.

FIG. 5 is a graphical plot of the energy gap for a (31,0) carbon nanotube as a function of gate voltage applied as shown in FIG. 1b. As can be seen from FIG. 5, the energy band gap is reduced with increasing gate voltage. This means that the carbon nanotube becomes increasingly electrically conductive as the voltage $V_g$ across the two gate electrodes 22 is increased. Such change in electrical conductance of the carbon nanotube is illustrated in FIG. 6. As can be seen from this figure, the electrical conductance increased from 0.011 2.$e^2$/H when there is no voltage across the two gate electrodes to 0.81 2.$e^2$/H when $V_g$ is at 6 volts.

A unique property of carbon nanotubes is their ability to be semiconducting or metallic, depending on the atomic arrangement (diameter, chirality) of the tube. Semiconducting tubes typically exhibit an energy gap smaller than 1 eV.

Figure 7A:
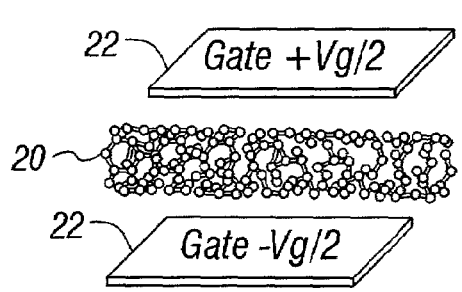
FIG. 7a is a partly cross-sectional and partly perspective view of a multi-wall nanotube between two gate electrodes for illustrating one embodiment of the invention.

The carbon nanotube of FIG. 1b can be a SWNT or a multiple wall nanotube (MWNT), as illustrated in FIG. 7a.

Thus, as shown in FIG. 7a, the MWNT 20 is placed substantially between two electrically conductive components 22 which may be metal plate electrodes. The space between the nanotube 20 and gate electrodes 22 may be filled by a dielectric material such as silicon dioxide. In such event, the use of a MWNT may be advantageous since the outer shell of such nanotube forms an interface with the dielectric material and forms a shield for the inner walls of the tube 20. This allows the inner walls of the tube 20 to maintain their intrinsic characteristics without being affected by contact with the dielectric or other outside materials. If the tube 20 is semiconducting, it has been found that the outer shells do not shield the inner walls from an applied electric field. This means that the inner walls of MWNT 20 do not feel the presence of the outer shell.

Figure 7B:
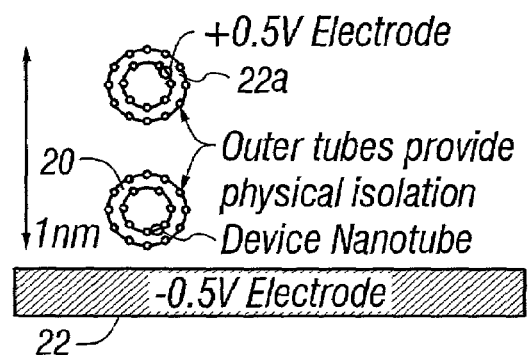
FIG. 7b is a cross-sectional view of a nanotube field-effect structure to illustrate another embodiment of the invention.

Instead of using metal plates for the gate electrodes 22 for applying the electric field to a nanotube, one (or both) of the electrodes may take the form of another nanotube, such as another MWNT 22a as shown in FIG. 7b. FIG. 7b is a cross-sectional view of tubes 20, 20a and plate 22. As shown in FIG. 7b, tubes 20, 22a are substantially parallel along their lengths.

Figure 8:
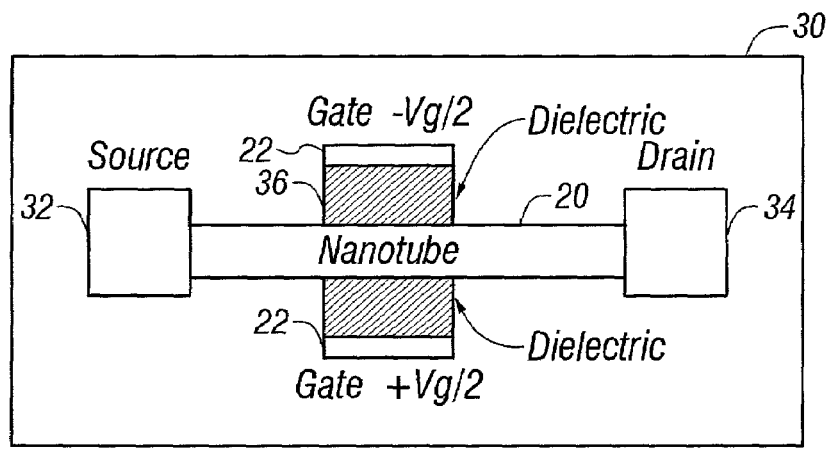
FIG. 8 is a schematic view of a nanotube field-effect switch to illustrate one more embodiment of the invention.

FIG. 8 is a schematic view of a nanotube field effect switch 30 which illustrates one application of the invention. As discussed above, electrical conductance of a nanotube can be controlled by controlling strength of the electrical field applied to the tube in a direction transverse to the length of the tube. As shown in FIG. 8, the nanotube 20 connects a source electrode 32 and a drain electrode 34. By applying an appropriate gate voltage across the two gate electrodes 22 separated from tube 20 by dielectric material 36, the electrical conductance of the portion of tube 20 that is between gates 22 can be modified. This in turn modifies the electrical conductance of tube 20 between the source and drain electrodes 32 and 34. Gates 22 may extend only over a portion of the nanotube 20 or the entire extent of the tube. By controlling the gate voltage across gate electrodes 22, the electrical conductance of switch 30 may be controlled in a desired manner. Switch 30 therefore operates in a manner similar to a field effect transistor.

Figure 9A:
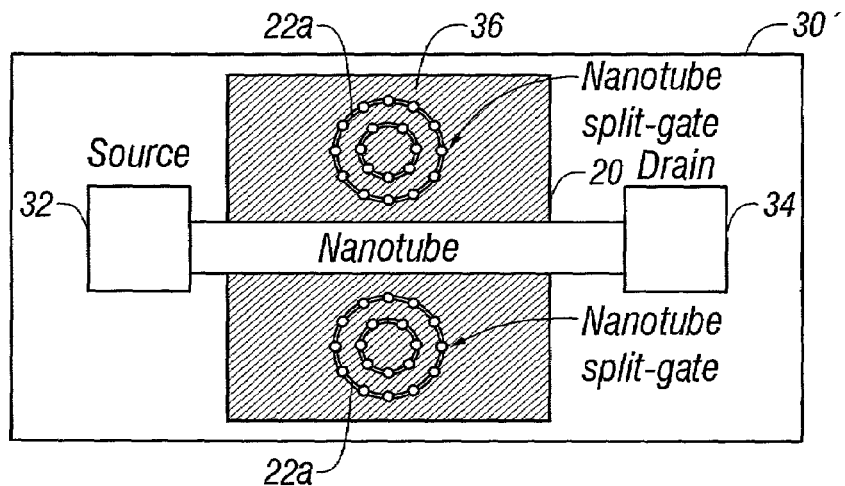
FIGS. 9a, 9b are schematic views of two additional different embodiments of a nanotube field-effect switch.
Figure 9B:
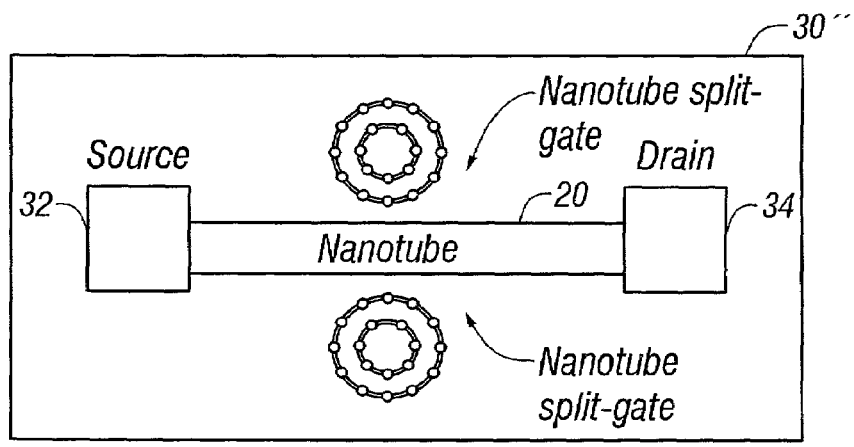

FIGS. 9a, 9b are schematic views of field effect switches to illustrate embodiments of a switch somewhat different from that of FIG. 8. As shown in FIG. 9a, the space between the two MWNTs 22a and the nanotube 20 is filled by a dielectric material such as silicon dioxide 36. In contrast, the space between the two gate electrodes 22a in the embodiment in FIG. 9b is not filled by any dielectric. In the embodiments of FIGS. 9a, 9b, the two nanotubes 22a serving as gate electrodes form a cross junction with the nanotube 20. Such a configuration may be advantageous since the cross-junction is of nanometer dimensions along the axes of tube 20 and of tubes 22a, so that the switches 30' and 30" of FIGS. 9a, 9b can be made to be quite small. Thus, one is therefore not limited by the limitation of photolithography in miniaturizing field effect switches using nanotubes in the embodiments of FIGS. 9a, 9b.

Figure 10A:
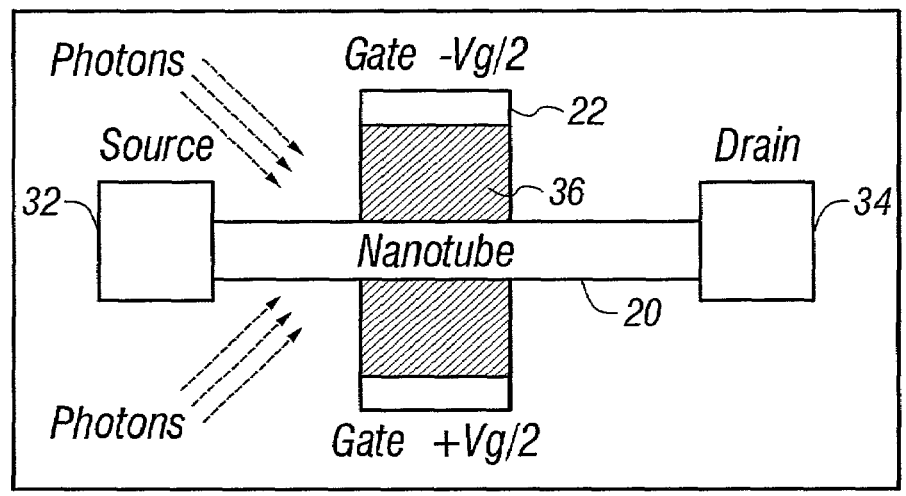
FIG. 10a is a schematic view of a photodetector that includes a nanotube placed between two gate electrodes.
Figure 10B:
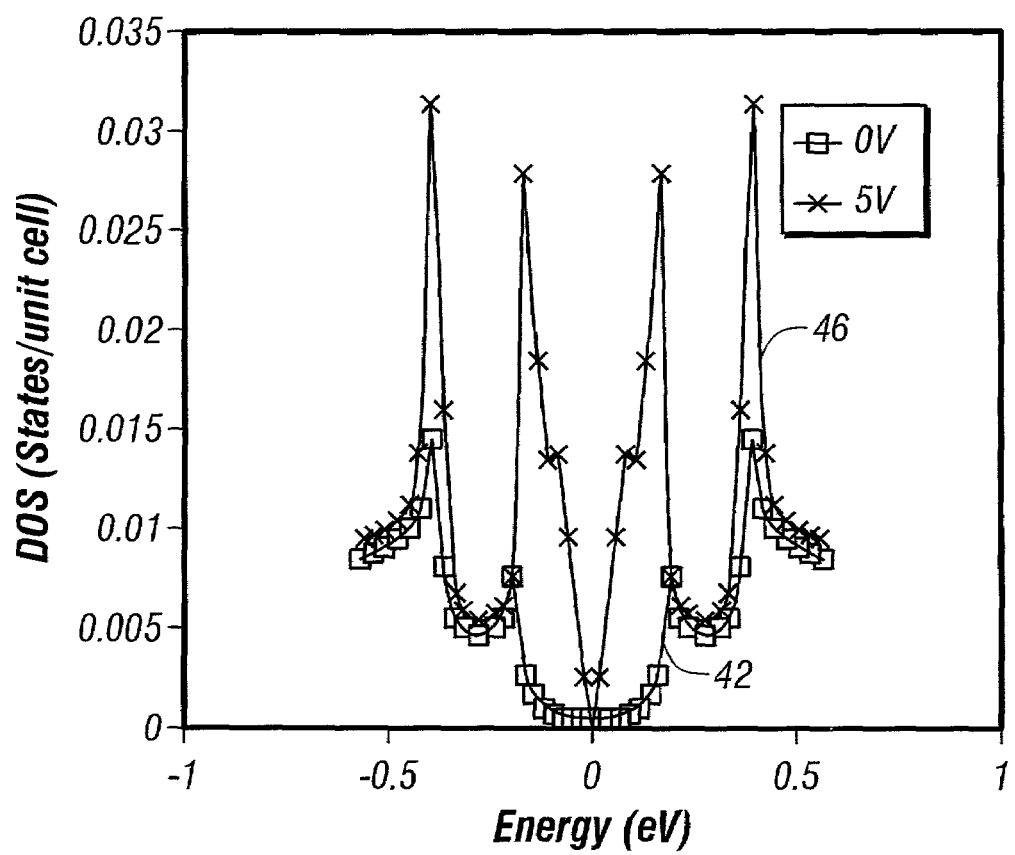
FIG. 10b is a graphical plot of the density of states (DOS) of electrons at different energies in the nanotube of FIG. 10a at three different gate voltages.

FIG. 10a is a schematic view of a photodetector to illustrate another embodiment of the invention. As noted above, a change in the energy band gap of the carbon nanotube also affects the radiation absorption characteristics of the tube. This is illustrated in FIG. 10b. When no gate voltage is applied, the four energy levels are indicated by curve 42. When the gate voltage across electrode 22 increases to five volts, the density of states curve shifts to curve 46. Therefore, from FIG. 10b, it is apparent that when the gate voltage is increased, the energy band gap between the two energy levels adjacent to the zero potential becomes smaller. This means that less photon energy would be absorbed by an electron that transits from a lower energy state to a higher energy state when the gate voltage is high compared to the transition energy absorbed when a smaller gate voltage or no gate voltage is applied. This means that as the gate voltage increases, the energy of the photons that are absorbed by the nanotube decreases and the wavelength of these photons increases. When the energy of the photons is absorbed by the nanotube, electron-hole pairs are created in the nanotube 20, which causes a current flowing between the source 32 and drain 34, resulting in a photodetector operation. In other words, when photons of the appropriate energy are supplied to the nanotube, such photons are absorbed and result in a source-drain current in a typical photodetector operation. Photons with energies that are less than the energy band gap as illustrated in FIG. 10b will not be absorbed by the nanotube. Therefore, by controlling the gate voltage applied to the nanotube 20, it is possible to control the wavelength of photons that are absorbed by the nanotube and therefore to control its radiation absorption spectrum.

Figure 11:
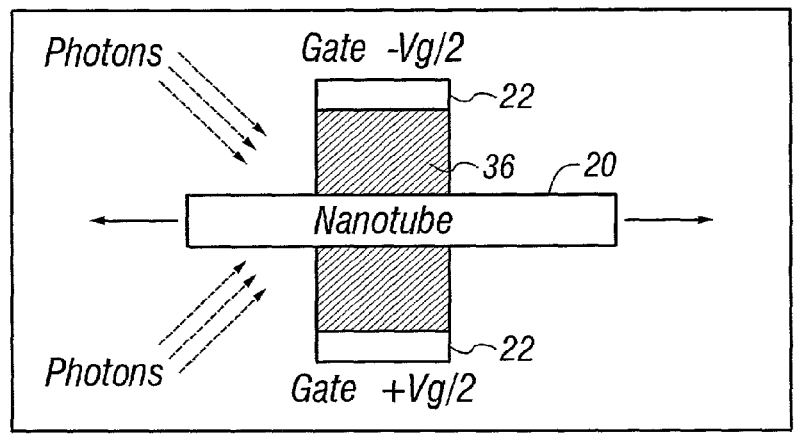
FIG. 11 is a schematic view of a tunable optical polaron generator useful for illustrating the invention.

FIG. 11 is a schematic view of a tunable optical polaron generator to illustrate yet another embodiment of the invention. As described above in reference to FIG. 10a, 10b, the edges of the wavelength absorption band of nanotube 20 may be controlled by controlling the gate voltage applied across the gate electrodes 22. The application of photons with wavelengths within the absorption band of nanotube 20 causes the generation of electron hole pairs in the nanotube, which causes the tube to deform mechanically, such as by elongating or shortening the tube or bending the tube. Therefore, by controlling the strength of electric field applied across the tube in a direction transverse to its length, it is possible to control the absorption band of the nanotube as described above, and therefore also control the response of the nanotube to photons having the desired wavelength, that is, wavelengths within the absorption band of the nanotube. The mechanical deformation of the nanotube may then be used for a variety of purposes, such as the closing or opening of electrical or optical switches. For a more detailed description of the effect of polarons in semiconducting carbon nanotubes, please see "Polarons in Carbon Nanotubes," M. Verissimo-Alves et al., Phys. Rev. Lett., Vol. 86, No. 15, pp. 3372-3375 (Apr. 9, 2001).

Figure 12:
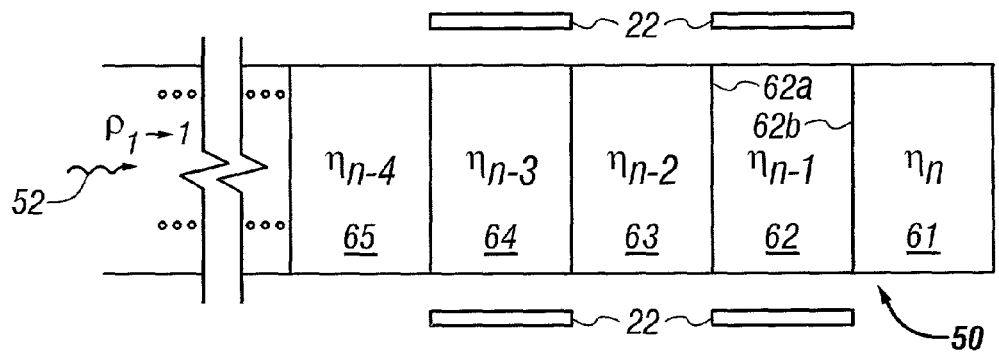
FIG. 12 is a schematic view of a distributed Bragg reflector to illustrate an aspect of the invention.

FIG. 12 is a schematic view of a distributed Bragg reflector to illustrate an aspect of the invention. As shown in FIG. 12, an optical medium 50 is elongated in shape and is divided into a number of sections where each of the sections has a width that is a multiple of the quarter wavelength of electromagnetic radiation 52 directed towards the sections. The odd numbered sections 61, 63, 65 . . . have the same index of refraction, such as 2.75, as illustrated in the equation below. The even numbered sections 62, 64, . . . also have substantially the same index of refraction, such as 3.75, which is different from the index of refraction of the odd numbered sections as illustrated in the equation below. Then the reflectivity of the sections is also given by equation below.

Choose $\eta_n = \eta_{n-2} = \eta_{n-4} \ldots = 2.75$

Choose $\eta_{n-1} = \eta_{n-3} = \eta_{n-5} \ldots = 3.75$

Reflectivity ρ for $$\frac{\lambda}{4}$$

sections:

$$\rho_{(n-1)} = \frac{\eta_{(n-1)}\left[\frac{1-\rho n}{1+\rho n}\right] - \eta_n}{\eta_{(n-1)}\left[\frac{1-\rho n}{1+\rho n}\right] + \eta_n}$$

Recursive results for n=20 are:

$$\rho_{20} = 0.1538$$
$$\rho_{19} = -0.3006$$
$$\rho_{18} = 0.43434$$
$$\rho_{17} = 0.5513$$
$$\downarrow$$
$$\rho_4 = 0.9898$$
$$\rho_3 = 0.9925$$
$$\rho_2 = 0.9945$$
$$\rho_1 = 0.\_\_\_0.9995$$

As shown in the equations above, if enough sections are included, the reflectivity of all of the sections together approaches one. In other words, if enough sections are included, all of the radiation in input beam 52 will be reflected by medium 50.

The different sections in medium 50 may be achieved by the application of electric fields in directions transverse to a carbon nanotube 50 along selected locations. For example, a pair of gate electrodes 22 may be placed substantially on opposite sides of each of the even numbered sections 62, 64, . . . , where each pair of gate electrodes has widths that are coextensive with the even numbered section of the nanotube that is sandwiched by such pair. When an electric field is applied across each pair of gate electrodes, a quantum well develops in the corresponding section of the nanotube that has walls substantially at the edges of the sections. For section 62, for example, the walls of the quantum well at such section would be substantially at locations 62a and 62b that are substantially aligned with the edges of the pair of gate electrodes 22 that are on the opposite sides of section 62. The application of the electric field to this portion of the nanotube creates a quantum well in section 62 and changes its index of refraction to a higher value, such as from 2.75 to 3.75. Similar quantum wells are formed at other even numbered sections such as section 64, where the index of refraction is also increased, for example, from 2.75 to 3.75. In this manner, a distributed Bragg reflector as shown in FIG. 12 is achieved. By selecting the number of pairs of gate electrodes that are so employed along the even numbered sections of the tube, a desired reflectivity of the Bragg reflector can be achieved.

Figure 13:
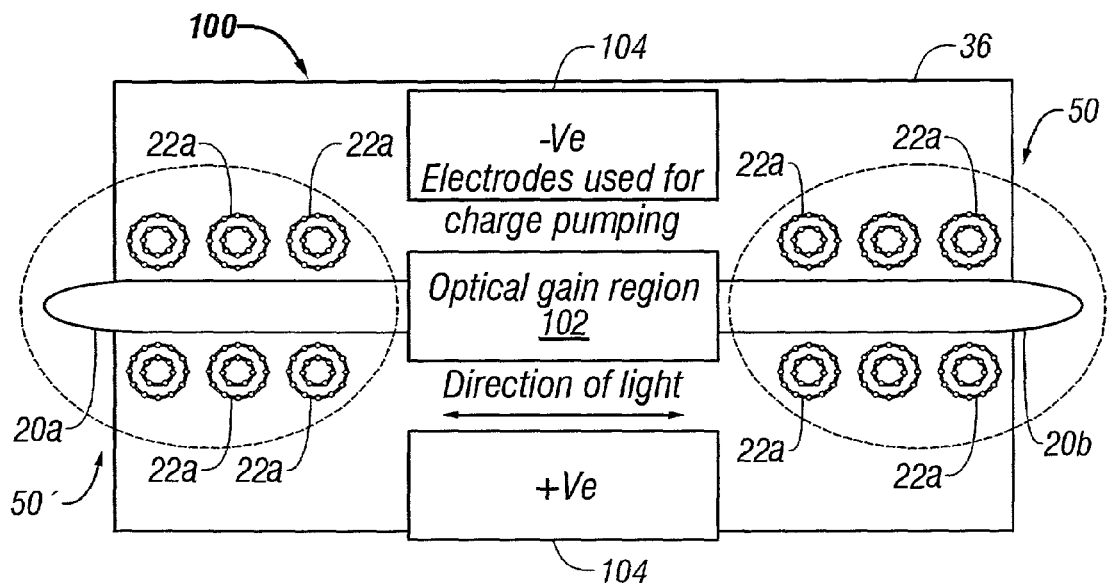
FIG. 13 is a schematic view of a side-emitting semiconductor laser with distributed Bragg reflectors on either end to illustrate an aspect of the invention.

The above-described Bragg reflector may be employed in semiconductor lasers, such as laser 100, as illustrated in FIG. 13. FIG. 13 is a schematic view of a side-emitting semiconductor laser with distributed Bragg reflectors on both ends to illustrate another embodiment of the invention. As shown in FIG. 13, two segments of a carbon nanotube 20a and 20b are placed with their ends adjacent to an optical gain region 102 which may be made of a semiconductor material as known to those skilled in the art, such as gallium arsenide material. When an appropriate electrical potential is applied across electrodes 104, typically a DC (direct current) voltage, electrons and holes are injected into region 102. The recombination of electrons and holes causes electromagnetic radiation to be generated. As shown in FIG. 13, pairs of MWNTs are placed on opposite sides of each of the two carbon nanotube segments 20a, 20b so that the two segments together with the MWNTs form two distributed Bragg reflectors 50' on both sides of region 102. The spacings between adjacent MWNTs are such that they are multiples of the desired quarter wavelength of the radiation to be generated by region 102 on account of the electron hole recombination. Therefore, at least a portion of the radiation at the desired wavelength generated in region 102 is reflected by the two distributed Bragg reflectors on both sides of the region back towards region 102, causing the region to lase at such wavelength. A portion of the radiation generated by region 102, however, escapes through the two Bragg reflectors 50'.

From the equations above, it is seen that reflectivity of the two Bragg reflectors 50' is determined by the index of refraction of the sections within the quantum wells along the two nanotube segments 20a, 20b. Therefore, by controlling the voltage across the pairs of MWNTs in the two reflectors 50', the reflectivity of the reflectors 50' can be controlled, thereby also controlling the operation of laser 100. By changing the locations of the plates 22, it is also possible to change the wavelength of the laser. Where it is possible to cause a portion of a carbon nanotube to perform the function of the optical gain region 102, a single nanotube may be used instead of the two segments 20a, 20b and a separate gain region 102. Such and other variations are within the scope of the invention. As can be seen from FIG. 13, the diameter of the laser beam generated by laser 100 can be as small as the diameter of the carbon nanotube, which may be advantageous for some applications. Where a larger beam of laser radiation is desired, multiple nanotubes may be employed instead of single nanotubes on the two sides of region 102.

Figure 14A:
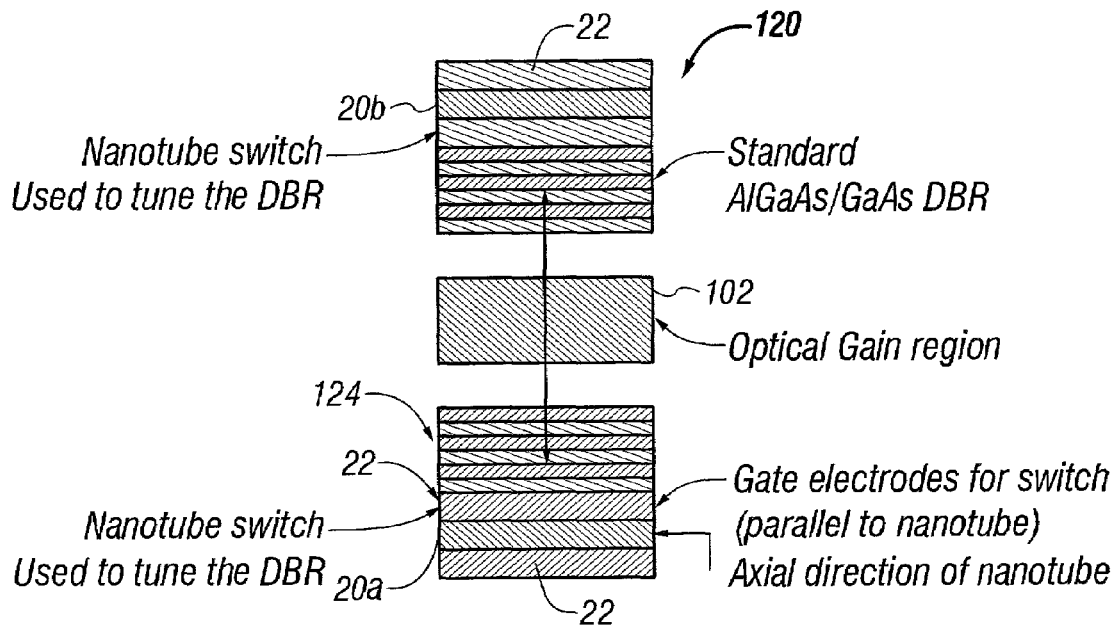
FIG. 14a is a cross-sectional view of a semiconductor structure and one or more nanotubes that form a part of a vertical-emitting semiconductor laser with distributed reflector(s) to illustrate another embodiment of the invention.

FIG. 14a is a cross-sectional view of a semiconductor structure and one or more nanotubes that form a part of a vertical-emitting semiconductor laser with distributed reflectors to illustrate another embodiment of the invention. Instead of placing the two segments of the nanotubes 20a, 20b with their ends pointing towards the optical gain region as in FIG. 13, in laser 120, the two nanotube segments are placed alongside and parallel to the long dimension of the optical gain region 102. A pair of gate electrodes 22 are placed substantially on opposite sides of each of the two nanotube segments, where their widths (in the direction perpendicular to the plane of this figure or paper) are smaller than the diameters of the nanotube segments. Therefore, when a voltage is applied across each pair of gate electrodes 22, a single quantum well would develop where the quantum well has substantially the same shape along the length of each of the two nanotube segments. Placed between the optical gain region 102 and the two nanotube segments are the standard distributed Bragg reflectors made of layers of aluminum gallium arsenide and gallium arsenide. Therefore, again by controlling the voltage across the two pairs of gate electrodes 22, it is possible to alter the reflectivity of the two nanotube segments, thereby controlling the laser 120. Electrons and holes are injected into the optical gain region 102 by means of a pair of electrodes (not shown) and the radiation generated in the region is partially reflected back towards the region by the reflectors 122, 124 and the two nanotubes, and a portion of such radiation escapes through these layers to form a vertical-emitting semiconductor laser.

Figure 14B:
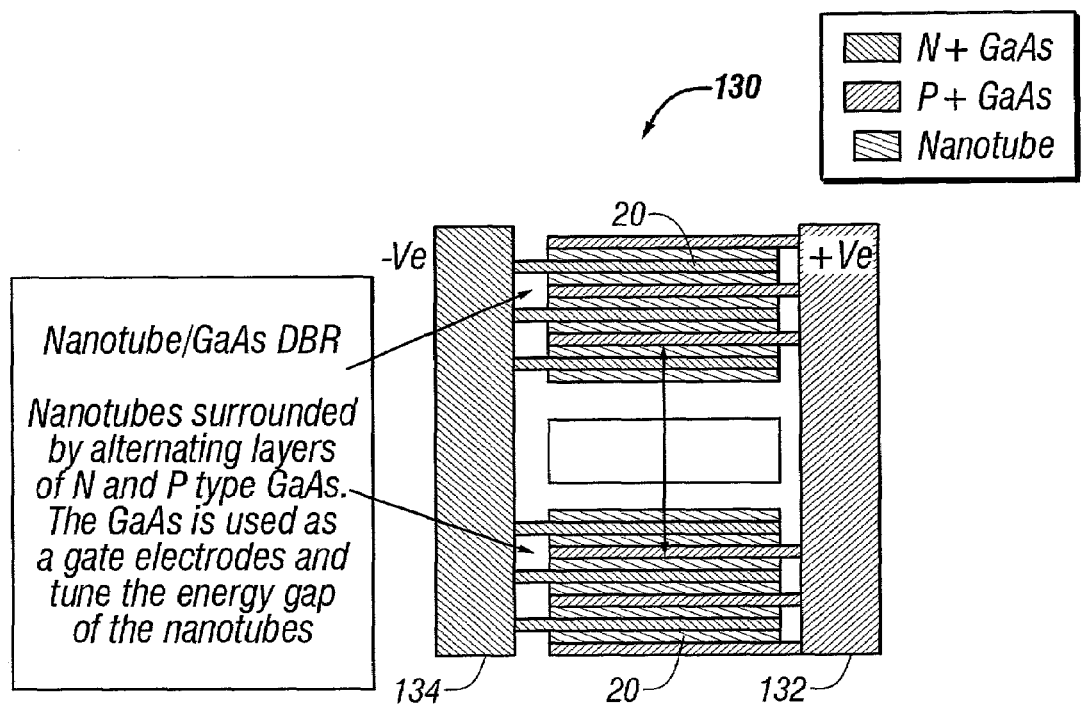
FIG. 14b is a schematic view of a semiconductor and nanotube structure with distributed Bragg reflectors to illustrate a vertical-emitting semiconductor laser.

FIG. 14b is a schematic view of a semiconductor and nanotube structure 130 with distributed Bragg reflectors to illustrate a vertical-emitting semiconductor laser. Instead of using a combination of the conventional reflectors made of gallium arsenide material and carbon nanotubes, it is possible to replace the gallium arsenide material with nanotubes as illustrated in FIG. 14b. Thus, voltages may be applied across each pair of gate electrodes 22 by means of electrodes 134 to cause quantum wells to be developed whose cross-sectional dimensions are substantially the same along the lengths of the six nanotubes 20, thereby forming distributed Bragg reflectors on both sides of optical gain region 102. The nanotubes may be surrounded by alternating layers of N and P type gallium arsenide, where the two types of gallium arsenide are used as gate electrodes for controlling the energy band gaps of the nanotubes for tuning their reflectivity. Thus, as shown in FIG. 14b, the N type gallium arsenide and the P type gallium arsenide 134 form alternating layers, where each nanotube is sandwiched between a N type and a P type gallium arsenide. As in FIG. 14a, part of the radiation generated by region 102 will be reflected by the nanotubes back towards the region, causing it to lase. Part of the radiation generated escapes through the nanotubes, thereby forming a vertical-emitting laser 130.

Figure 15A:
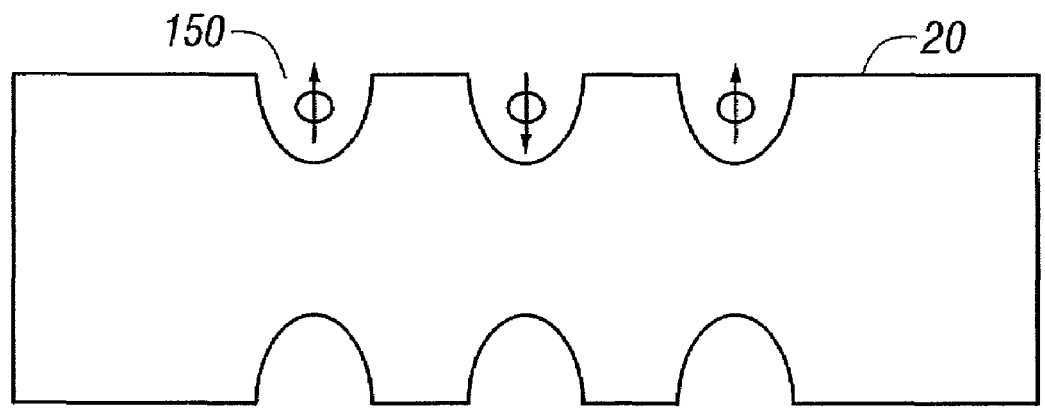
FIG. 15a is a schematic view of a nanotube or nanowire with multiple quantum wells created along the tube to illustrate how spins in the outer wells may be used to manipulate the spins in the center well in a quantum computer.

FIG. 15a is a schematic view of a nanotube with multiple quantum wells created along the tube to illustrate how spin states in the outer walls may be used to manipulate the spin states in a center well in a quantum computer. In the same manner as described above in reference to FIG. 13, quantum wells 150 of the type illustrated in FIG. 15a may be formed by the application of electric fields in directions transverse to the length of the nanotube 20. As shown in FIG. 15a, six quantum wells 150 are so formed. Each of the quantum wells may be used to store electrons or ions in well defined spin states, that is, with spins that point up or point down, where up and down are in reference to a reference direction.

Figure 15B:
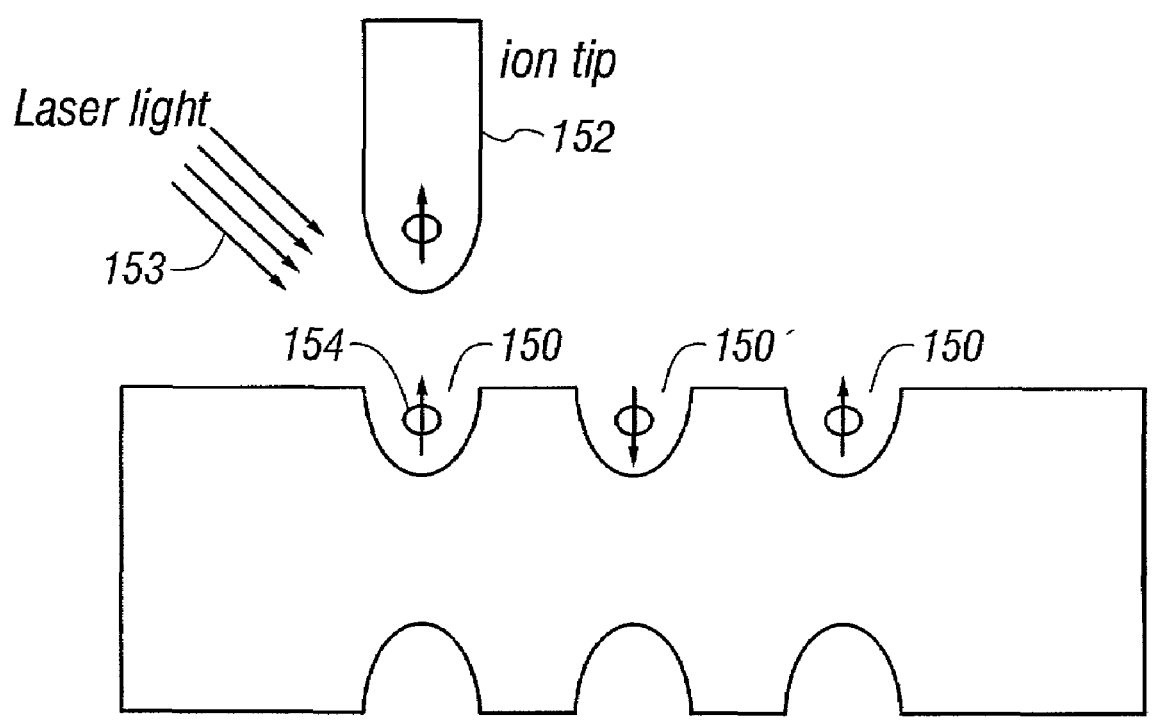

FIG. 15b is a schematic view of the nanotube of FIG. 15a and of an ion tip in the vicinity of a quantum well and laser light supplied to the well to illustrate a process in a quantum computer of FIG. 15a. As shown in FIG. 15b, the spin state of an electron or ion within a quantum well may be detected by means of an ion tip 152 placed in the vicinity of such quantum well. If radiation 153 such as light from a laser is supplied to the quantum well at the same time, the presence of the ion tip may induce a change in the spin state of electrons or ions 154 within well 150, thereby accomplishing a writing operation. The spin state in the center quantum well 150' is influenced by the spin state of electrons or ions in adjacent wells 150. Therefore, by changing the spin state of electrons or ions in quantum wells 150, it is possible to alter the spin state of electrons or ions in the center quantum well 150'. Such interaction between the spin states of adjacent quantum wells can be used for quantum computing. Operations that can be achieved through such interactions include logic OR, AND, NOR, NAND and other processes. For more detailed description of the operation of quantum computers, please see "A Scalable Quantum Computer with Ions in an Array of Microtraps," J. I. Cirac et al., Nature, Vol. 404 (Apr. 6, 2001) www.nature.com, pp. 579-581.

While the invention has been described above by reference to various embodiments, it will be understood that changes and modifications may be made without departing from the scope of the invention, which is to be defined only by the appended claims and their equivalent. For example, the invention is illustrated by embodiments where the application of an electric field causes the energy band gap to become narrower. It is possible for some materials that the application of an electric field causes the energy band gap to become wider. While the embodiments described above employ carbon nanotubes, the same principles may be applicable to nanotubes made of materials other than carbon, such as silicon and germanium, or other elements in group IV of the periodic table. The same principles can also be applied to nano-structures of shapes other thas nanotubes, such as nano-wires, for example. Such and other variations are within the scope of the invention. All references referred to herein are incorporated by reference in their entireties.

What is claimed is:

1. A nanometer scale apparatus, comprising:
   an elongated structure with nanometer cross-sectional dimensions; and
   a device comprising components substantially on opposite sides of the elongated structure, said components applying an electric field across them to the elongated structure in a direction transverse to the elongated structure so that an electronic energy band structure of the elongated structure is modulated without substantially moving any portion of the elongated structure, wherein said electric field is not less than about 1 MV/m; wherein said change in energy band structure also causes a shift in optical energy absorption wavelength characteristics by the elongated structure.

2. The apparatus of claim 1, wherein said structure comprises a silicon or carbon material.

3. The apparatus of claim 1, wherein said components comprise at least one nanotube or nanowire.

4. The apparatus of claim 1, wherein said components comprise at least one multiple wall nanotube.

5. The apparatus of claim 1, wherein said components comprise two elongated nanotubes or nanowires oriented in directions transverse to the elongated structure and applying the electric field to a portion of the elongated structure at a location between and overlapping the two nanotubes or nanowires of the components, thereby forming a cross junction arrangement with the elongated structure.

6. The apparatus of claim 1, further comprising a dielectric material between the components and the elongated structure.

7. The apparatus of claim 1, wherein said structure comprises at least one multiple wall nanotube.

8. The apparatus of claim 1, wherein said structure comprises at least one zigzag carbon nanotube.

9. The apparatus of claim 1, wherein said electric field causes change in electrical conductance of the elongated structure by redistributing electrical charge on the elongated structure without changing net electrical charge on the elongated structure.

10. The apparatus of claim 1, wherein said structure comprises at least one semiconducting nanotube or nanowire.

11. The apparatus of claim 1, wherein said change in energy band structure also causes a change in electrical conductance of the elongated structure.

12. The apparatus of claim 1, wherein said components applies the electric field to a section of the elongated structure, so that the change in energy band structure caused by the field also causes a quantum well to develop at or near the section of the elongated structure.

13. The apparatus of claim 1, wherein said components apply electric field(s) to two or more sections of the elongated structure, wherein said sections are spaced apart from one another, so that the change in energy band structure caused by the field also causes a number of quantum wells to develop at or near the sections of the elongated structure.

14. The apparatus of claim 1, said structure comprising a crystalline material.

15. The apparatus of claim 1, wherein said electric field causes a band gap of the electronic energy band structure to become narrower.

16. The apparatus of claim 1, said structure comprising a homogeneous material throughout the structure.

17. The apparatus of claim 1, wherein said components apply the electric field to the elongated structure so that there is an electric field gradient across the elongated structure.

18. A nanometer scale apparatus, comprising:
an elongated structure with nanometer cross-sectional dimensions; and
a device comprising components substantially on opposite sides of the elongated structure, said components applying an electric field across them to the elongated structure in a direction transverse to the elongated structure so that an electronic energy band structure of the elongated structure is modulated without substantially moving any portion of the elongated structure, wherein said electric field is not less than about 1 MV/m, wherein said components apply electric field(s) to two or more sections of the elongated structure, wherein said sections are spaced apart from one another, so that the change in energy band structure caused by the field also causes a number of quantum wells to develop at or near the sections of the elongated structure, wherein said sections are spaced apart from one another by spacings selected such that the elongated structure reflects electromagnetic radiation of wavelengths that are functions of the spacings.

19. A nanometer scale photodetector apparatus, comprising:
an elongated structure with nanometer cross-sectional dimensions;
a device comprising components substantially on opposite sides of the elongated structure, said components applying an electric field across them to the elongated structure in a direction transverse to the elongated structure to cause a shift in optical energy absorption wavelength characteristics by the elongated structure by modulating an electronic energy band structure of the elongated structure without substantially moving any portion of the elongated structure, wherein said electric field is not less than about 1 MV/m; and
two electrical terminals electrically connected to the elongated structure.

20. The apparatus of claim 19, said device further comprising a voltage source applying an electrical potential across said components, said source being tunable to select wavelength of radiation that is absorbed by the elongated structure.

21. The apparatus of claim 19, said elongated structure comprising substantially the same material throughout the structure.

22. The apparatus of claim 19, wherein said structure comprises at least one nanotube or nanowire.

23. A nanometer scale polaron apparatus, comprising:
an elongated structure with nanometer cross-sectional dimensions;
a device comprising components substantially on opposite sides of the elongated structure, said components applying an electric field across them to a portion of the elongated structure in a direction transverse to the elongated structure to modulate an electronic energy band structure of the portion of the elongated structure, wherein said electric field is not less than about 1 MV/m; and
a source providing radiation to the portion to cause a change in length of the elongated structure.

24. A nanometer scale radiation reflector apparatus, comprising:
an elongated structure with nanometer cross-sectional dimensions; and
a device comprising components substantially on opposite sides of the elongated structure, said components applying an electric field across them to a portion of the elongated structure in a direction transverse to the elongated structure to cause a plurality of quantum wells along a length of the elongated structure by modulating an electronic energy band structure of the elongated structure, said wells being spaced apart by spacings selected to reflect radiation of predetermined wavelengths, wherein said electric field is not less than about 1 MV/m.

25. The apparatus of claim 24, said device further comprising a plurality of pairs of elongated electrodes, each pair located substantially on opposite sides of the elongated structure and oriented in directions transverse to the elongated structure, the spacing between each pair of electrodes selected to reflect radiation of predetermined wavelengths.

26. A nanometer scale laser apparatus, comprising:
an optical gain region;
one or more elongated structure(s) on one or more than one side of the region, each of said structure(s) having nanometer cross-sectional dimensions;
a device comprising components substantially on opposite sides of each of the one or more structure(s), said components applying an electric field across them to a portion of each of the one or more structure(s) in a direction transverse to such structure to cause one or more quantum wells in such structure by modulating an electronic energy band structure of the elongated structure, wherein said electric field is not less than about 1 MV/m; and
an instrument causing electrons and holes to be injected into the region.

27. The apparatus of claim 26, said components comprising a pair of elongated electrodes located substantially on opposite sides of the elongated structure and oriented in directions substantially along a length of the elongated structure.

28. A nanometer scale quantum computing apparatus, comprising:
an elongated structure with nanometer cross-sectional dimensions; and
a device comprising components substantially on opposite sides of the elongated structure, said components applying an electric field across them to a portion of the elongated structure in a direction transverse to the elongated structure to cause a plurality of quantum wells adjacent to one another along a length of the elongated structure by modulating an electronic energy band structure of the elongated structure, said wells trapping ions, wherein said electric field is not less than about 1 MV/m, a source supplying radiation to at least one of the wells; and an ion tip in the vicinity of the at least one of the wells, causing a change in state of ions in such well when radiation is supplied to such well, and detecting the state of ions in such well when radiation is not supplied to such well.

* * * * *